(12) United States Patent  
Shimbayashi

(10) Patent No.: US 7,190,630 B2  
(45) Date of Patent: Mar. 13, 2007

(54) SEMICONDUCTOR STORAGE DEVICE AND METHOD OF SELECTING BIT LINE OF THE SEMICONDUCTOR STORAGE DEVICE

(75) Inventor: Koji Shimbayashi, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/155,510

(22) Filed: Jun. 20, 2005

(65) Prior Publication Data

US 2005/0276147 A1 Dec. 15, 2005

Related U.S. Application Data

(63) Continuation of application No. PCT/JP2003/007233, filed on Jun. 6, 2003.

(51) Int. Cl.  
*G11C 8/00* (2006.01)

(52) U.S. Cl. .................... 365/230.05; 365/230.01; 365/230.06

(58) Field of Classification Search .......... 365/230.05  
See application file for complete search history.

(56) References Cited

U.S. PATENT DOCUMENTS

2002/0062433 A1* 5/2002 Suzuki ................ 711/203

2003/0103396 A1* 6/2003 Maruyama et al. ......... 365/201

FOREIGN PATENT DOCUMENTS

| JP | 09-245493 | 9/1997 |
|----|-----------|--------|
| JP | 10-069773 | 3/1998 |
| JP | 11-086558 | 3/1999 |
| JP | 2000-132985 | 5/2000 |
| JP | 2001-256789 | 9/2001 |
| JP | 2003-162897 | 6/2003 |

* cited by examiner

*Primary Examiner*—Thong Q. Le  
(74) *Attorney, Agent, or Firm*—Arent Fox LLP

(57) ABSTRACT

Of bit line selection address bits A(k) to A(k+3), address bits A(k+1) and A(k+2) are subjected to exclusive OR operation with address bit A(k+3) by an address conversion circuit 20, and when address bit A(k+3) is at high level, the address is inputted to an upper column decoder 11 with their logical levels inverted. In left and right areas AA0 and AA1 of eight bit lines within subarray AA, the order of selecting bit lines is switched in ascending order and descending order every four lines. With the construction of a lower pass gate 220 that alternately selects the left and right areas AA0 and AA1 for each access, in continuous access within subarray and between subarrays, the distance between bit lines selected in adjacent accesses can be sufficiently secured, so that the electrical influence of a bit line accessed previously exerts no influence on a bit line accessed subsequently.

13 Claims, 13 Drawing Sheets

SEMICONDUCTOR STORAGE DEVICE AND METHOD OF SELECTING BIT LINE OF THE SEMICONDUCTOR STORAGE DEVICE

CROSS-REFERENCE TO RELATED APPLICATIONS

This application is a continuation application based upon and claims the benefit of the prior PCT International Patent Application No. PCT/JP2003/007233 filed on Jun. 6, 2003, the entire contents of which are incorporated herein by reference.

BACKGROUND OF THE INVENTION

1. Field of the Invention

The present invention relates to technology for selecting bit lines in a semiconductor storage device, and more particularly to bit line selection technology at the time of successive selections of plural bit lines.

2. Description of Related Art

Conventional semiconductor storage devices split a memory cell array into plural subarrays, and successively selects one bit line from plural bit lines provided in each subarray to read out data. In such a way, they have performed continuous read operation such as burst read access.

As disclosed in Japanese Unexamined Patent Publication No. 2000-132985, an example of a circuit configuration of a nonvolatile semiconductor storage device such as flash memory is shown in FIG. 11. A memory cell array is partitioned into a subarray AA (identified by column address bit A(k+4) of low level) and subarray AB (identified by column address bit A(k+4) of high level), which are identified by column address bit A(k+4) and other address bit(s). Moreover, the individual subarrays AA and AB are split into left areas AA0 and AB0, and right areas AA1 and AB1, and each of the areas has plural nonvolatile transistors disposed at the intersections of plural word lines and plural bit lines. Through nonvolatile transistors selected according to one activated word line WLn of plural word lines, bit lines BL0A to BL15A (subarray AA) and BL0B to BL15B (subarray AB), and ground potential are controlled to connection or non-connection. The existence of a current flowing to a route through the nonvolatile transistors causes data stored in the nonvolatile transistors to be read into the bit lines BL0A to BL15A and BL0B to BL15B. Since the above configuration is the same between the subarrays AA and AB, the subarray AA will be described below.

One bit line is selected from among the bit lines BL0A to BL15A after upper pass gates 210 and 211 and a lower pass gate 220 are controlled by an upper column decoder 11 and a lower column decoder 12, and is connected to a data line DB. In FIG. 11, a selection is made by a four-bit column address bit of column address bits A(k) to A(k+3). The column address bits A(k+1) to A(k+3) are decoded by the upper column decoder 11, and one decode signal YD10 to YD17 is outputted. As a result, proper pass gate transistors within the upper pass gates 210 and 211 are selected. Furthermore, the column address bit A(k) is decoded by the lower column decoder 12, and one of decode signals YD20 and YD21 is outputted. As a result, one of two pass gate transistors within the lower pass gate 220 is selected.

The subarrays AA and AB are identified by column address bit A(k+4) and other address bit(s) not shown. Or, they are identified by being connected to different data buses.

A current-voltage conversion circuit 320 is connected to the data line DB. A current flowing through a route formed by a nonvolatile transistor selected by word line WLn is converted into voltage, and the voltage is compared with a comparison voltage VRF in an amplifier 330 of subsequent stage to perform data amplification.

To continuously perform read operation, a column address is successively incremented. FIG. 12 shows the order of selection bit lines connected to the data line DB as column address is incremented. Each time address is incremented, a lower column address bit A(k) changes. The decode signals YD20 and YD21 are alternately selected. The upper column address bits A(k+1) to A(k+3) are incremented every one cycle of the lower column address bit A(k), and decode signals YD10 to YD17 are selected one after another. As a result, selected bit lines are sequentially selected in the left area AA0 or the right area AA1 while being alternately switched between the left area AA0 and the right area AA1.

At this time, before the changeover of selected bit lines, a reset operation is performed by a reset circuit 310 to discharge a charge between the data line DB and a selected bit line to ground voltage.

In Japanese Unexamined Patent Publication No. H9(1997)-245493, technology is disclosed for disposing a ground shield line between selected bit lines and adjacent non-selected bit lines to prevent interference caused by capacitive coupling between adjacent bit lines.

BRIEF SUMMARY OF THE INVENTION

However, when continuous data read operation is performed beyond the subarrays AA and AB, bit lines BL15A and BL0B adjacently disposed in the boundary of the subarrays AA and AB are continuously selected (in FIG. 12, selection of 16-th bit line and selection of 17-th bit line). In recent years, as semiconductor storage devices become microscopic and larger in capacity, the interval between bit lines has become narrower and bit length has become longer, so that inter-line parasitic capacitance between bit lines as well as the wiring capacitance of the bit lines themselves has become larger. In addition, higher-speed continuous read operation is also demanded.

During data reading, the data line and a selected bit line must be charged to an equalizing voltage (e.g., 0.6V). However, in a reset operation during the changeover of bit lines, the bit line must be discharged until the equalizing voltage is equal to ground voltage. The discharge circuit is the reset circuit 310. In accordance with an increase in the capacity of semiconductor storage devices, while the wiring capacitance of bit lines themselves increases and the amount of charges to be discharged increases, a CR time constant circuit is formed together with a wiring resistor of bit lines, and a delay may occur in a discharge operation. In addition, demand for higher speeds may make it difficult to secure sufficient reset time.

If, in the period of reset time, bit lines are not sufficiently discharged until their voltage level becomes equal to ground voltage, and charges remaining in the bit lines are stored as data "1" in nonvolatile transistors selected by word line WLn, the charges are discharged through the nonvolatile transistors. Since the discharge operation is performed in a read operation of a next cycle, when a bit line selected in the next cycle is an adjacent bit line and read data is "0" data, through inter-line parasitic capacitance between bit lines, capacitance coupling of charges may be performed from the selected bit line to a non-selected bit line in which a discharge operation is being performed. During reading of "0" data in which no current flows, unexpected current flows through the data line DB and the "0" may be incorrectly detected as "1" data.

If a shield line disclosed in the '493 publication is wired, the adverse effect of capacitive coupling due to inter-line parasitic capacitance can be eased. However, to wire the shield line, a new wiring area must be provided in parallel with bit lines within a memory cell array. This is undesirable in terms of chip integration.

The present invention has been made to solve the problem of the above-mentioned conventional technology, and provides a semiconductor storage device that enables stable continuous access operation by eliminating adverse effects due to capacitance coupling from adjacent bit lines without an increase in chip die size, and a method of selecting bit lines of the semiconductor storage device.

To achieve the above object, according to one aspect of the semiconductor storage device of the invention, there is provided a semiconductor storage device in which, with a storage cell connected to each of plural bit lines, continuous access is performed by that the bit lines are successively selected and connected to an amplifier circuit, wherein physically contiguous bit lines are partitioned into basic bit line groups in each of which two or more basic decode units identified by a lower identification address of a prescribed number of bits are contiguously disposed with bit lines within the basic decode unit being identified by a same order among the basic decode units, wherein the basic decode unit is constituted by bit lines identified by an upper identification address of a prescribed number of bits, and the semiconductor storage device comprises: an upper identification address decoder for selecting a prescribed bit line within the basic decode unit; a lower identification address decoder for selecting a prescribed basic decode unit; and an address conversion part that allocates at least one of a start address or an end address in identification address represented by the upper identification address and the lower identification address that identify bit lines partitioned into a basic bit line group to bit lines in physical positions Other than those of bit lines in both ends of the basic bit line group.

In the above-mentioned semiconductor storage device, for identification address successively incremented, lower identification address is decoded by a lower identification address decoder and one basic decode unit is successively selected from basic decode units constituting a basic bit line group. Every one cycle of selection of basic decode unit, upper identification address is decoded by an upper identification address decoder and bit lines within the basic decode unit are successively selected. In this case, by an address conversion part, at least one of bit lines at both ends of the basic bit line group is selected except in a start address or last address selected by an identification address.

Further, according to one aspect of the method of selecting bit lines in a semiconductor storage device of the invention, there is provided a method of selecting bit lines in a semiconductor storage device in which, with a storage cell connected to each of plural bit lines, continuous access is performed by that the bit lines are successively selected and connected to an amplifier, wherein physically contiguous bit lines are partitioned into basic bit line groups in each of which two or more basic decode units are contiguously disposed with bit lines within the basic decode unit being identified by a same order among the basic decode units, wherein the basic decode unit is constituted by bit lines identified by a partial identification address of a prescribed number of bits, and wherein the method of selecting bit lines includes the steps of: performing successive selections of bit lines partitioned into the basic bit line groups by successively changing selected basic decode units, with the physical positions of bit lines within the basic decode unit being fixed; and allocating at least one of a first selection or last selection of successive selections of bit lines partitioned into the basic bit line groups to a bit line in a physical position other than those of bit lines at both ends of the basic bit line group.

According to the above-mentioned method of selecting bit lines of the semiconductor storage device, in successive selections of bit lines partitioned into basic bit line groups, in the selecting step, physical positions of selected bit lines within a basic decode unit are fixed so that successive changes of basic decode units constituting a basic bit line group are preferentially performed. According to one cycle of selections of basic decode units, selections of bit lines within basic decode unit change. In the allocating step, of successive selections of bit lines, at least one of a first selection or last selection makes allocation to a bit line in a physical position other than those of bit lines at both ends of the basic bit line group.

By this construction, in the basic bit line group that partition physically contiguous bit lines, when continuous access is performed by that individual bit lines are successively selected and connected to an amplifier, the basic decode units are successively selected for each access by a lower identification address decoder for decoding the lower identification address or the selecting step. For the duration of this processing, the physical positions of bit lines within the basic decode unit are fixed. In this case, since the basic decode units are disposed so that a bit line identification order within the basic decode unit is the same among the basic decode units, that is, the order of selecting bit lines in the basic decode unit is maintained in the same direction (hereinafter referred to as shift disposition), bit lines successively selected between adjacent accesses are bit lines disposed in physical positions apart by a distance equal to the sum of the pitches of bit lines constituting the basic decode unit. Inter-line parasitic capacitance existing between bit lines successively selected becomes small, so that an electrical state remaining in a bit line selected in a preceding access exerts no influence on a bit line selected in a succeeding access.

Even if advances in the miniaturization and large capacity of semiconductor storage devices increase the wiring capacitance of bit lines and inter-line parasitic capacitance between adjacent bit lines, and high-speed operation causes the occurrence of residual charges of bit lines after access, an adverse effect on bit lines selected in succeeding accesses can be eliminated.

To eliminate the adverse effect of inter-line parasitic capacitance, a shield line does not need to be provided between adjacent bit lines, and desirably in terms of chip integration, bit lines can be efficiently disposed in memory cell arrays.

According to a second aspect of the semiconductor storage device of the invention, there is provided a semiconductor storage device in which, with a storage cell connected to each of plural bit lines, continuous access is performed by that the bit lines are successively selected and connected to an amplifier, wherein physically contiguous bit lines are partitioned into a basic bit line group of four bit lines each, and wherein the semiconductor storage device includes an address conversion part that allocates, of identification address of two bits identifying the order of selecting bit lines in the basic bit line group, an upper identification address to a lower physical address identifying the physical position of bit lines and an inverted lower identification address to an upper physical address identifying the physical positions of bit lines.

According to a third aspect of the semiconductor storage device of the invention, there is provided a semiconductor storage device in which, with a storage cell connected to each of plural bit lines, continuous access is performed by that the bit lines are successively selected and connected to an amplifier, wherein physically contiguous bit lines are partitioned into a basic bit line group of four bit lines each, and wherein the semiconductor storage device includes an address conversion part that allocates, of identification address of two bits identifying the order of selecting bit lines in the basic bit line group, an inverted upper identification address to a lower physical address identifying the physical position of bit lines and a lower identification address to an upper physical address identifying the physical position of bit lines.

In the above-mentioned semiconductor storage device, one of identification address of two bits identifying the order of selecting bit lines in the basic bit line group is logically inverted to reverse bit positions, and the identification address is allocated to upper and lower physical addresses identifying the physical positions of the bit lines.

According to a second aspect of the method of selecting bit lines in a semiconductor storage device of the invention, there is provided a method of selecting bit lines in a semiconductor storage device in which, with a storage cell connected to each of plural bit lines, continuous access is performed by that the bit lines are successively selected and connected to an amplifier, wherein physically contiguous bit lines are partitioned into a basic bit line group of four bit lines, and wherein the method of selecting bit lines includes the steps of: successively selecting bit lines partitioned into the basic bit line groups in terms of physical positions in a first selection order in which the bit lines are selected in a third physical position, a first physical position, a fourth physical position, and a second physical position, or in a second selection order in which the bit lines are selected in a second physical position, a fourth physical position, a first physical position, and a third physical position; and partitioning physically contiguous bit lines by disposing basic bit line groups having any one of the first or second selection order, or by alternately disposing basic bit line groups having the first or second selection order.

In the above-mentioned method of selecting bit lines in the semiconductor storage device, in the selecting step, bit lines in the basic bit line group are selected in the first selection order or second selection order. In the partitioning step, physically contiguous bit lines are partitioned into the basic bit line group having any one of the first or second selection order (shift disposition of the basic bit line group), or partitioned into alternately disposing the basic bit line group having the first or second selection order (mirror disposition of the basic bit line group).

By this construction, one of identification address of two bits identifying the order of selecting bit lines is logically inverted to reverse bit positions, and the identification address is allocated as physical address identifying the physical position of the bit lines, whereby bit lines in the basic bit line group can be selected in the first or second selection order. As a disposition among the basic bit line groups, either of the shift disposition and the mirror disposition is possible.

In the basic bit line group that partition physically contiguous bit lines, when continuous access is performed by successively selecting individual bit lines and connecting them to an amplifier circuit, bit lines successively selected between adjacent accesses can be handled as bit lines disposed in physical positions apart by a sufficient distance without being physically adjacent. Inter-line parasitic capacitance existing between bit lines successively selected becomes small, so that an electrical state remaining in a bit line selected in a preceding access exerts no influence on a bit line selected in a succeeding access.

Even if advances in the miniaturization and large capacity of semiconductor storage devices increase the wiring capacitance of bit lines and inter-line parasitic capacitance between adjacent bit lines, and high-speed operation causes the occurrence of residual charges of bit lines after access, an adverse effect on bit lines selected in succeeding accesses can be eliminated.

To eliminate the adverse effect of inter-line parasitic capacitance, a shield line does not need to be provided between adjacent bit lines, and desirably in terms of chip integration, bit lines can be efficiently disposed in memory cell arrays.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, a description will be made of embodiments of a semiconductor storage device of the present invention and a method of selecting bit lines of the semiconductor storage device with reference to FIGS. 1 to 10.

Figure 1:
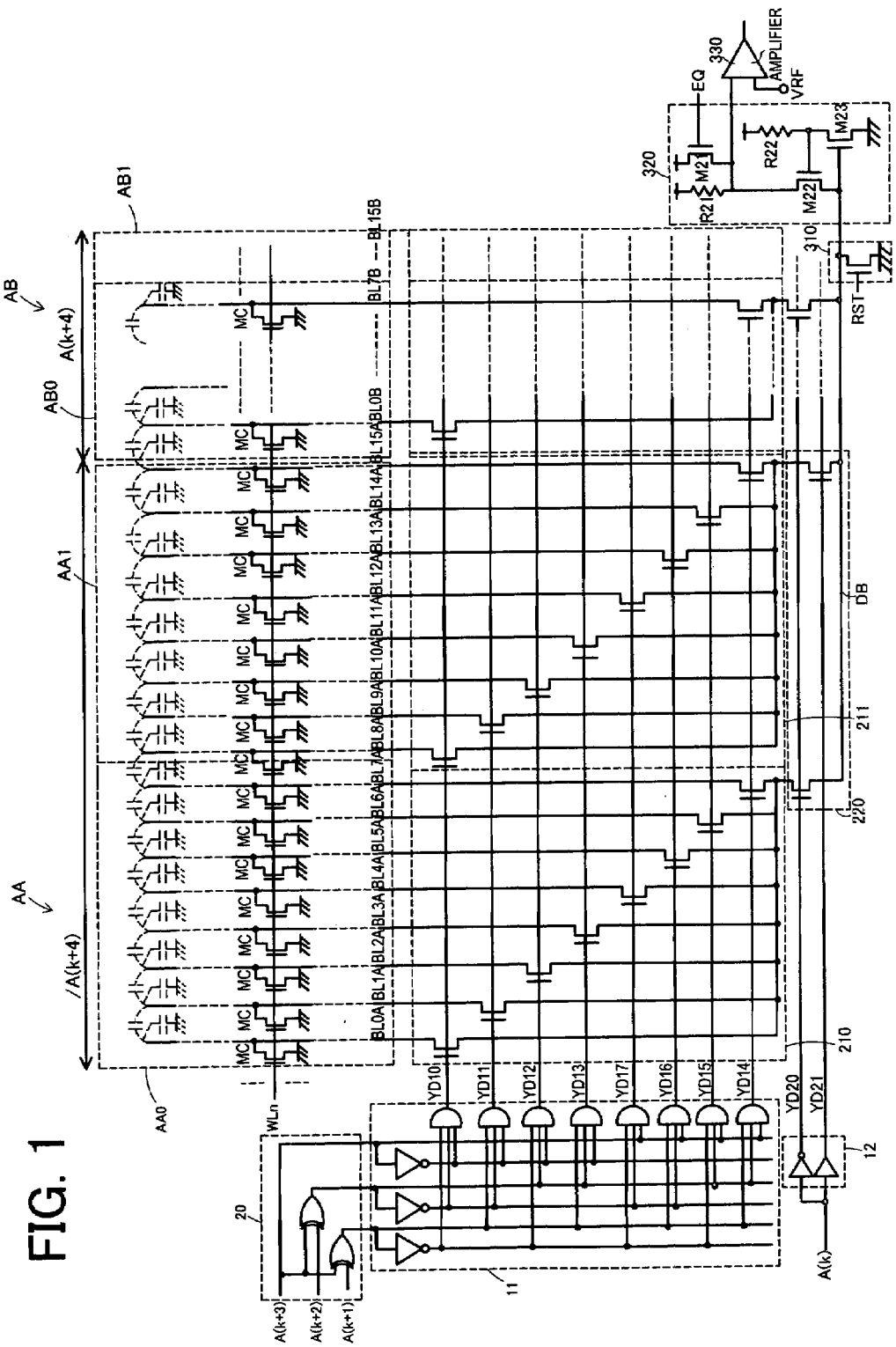
FIG. 1 is a circuit diagram of a first embodiment.

A circuit diagram of a first embodiment shown in FIG. 1 shows a circuit configuration for selecting one bit line from bit lines BL0A to BL15A, BL0B to BL15B, and so forth disposed in a memory cell array to connect it to a data line DB, and a method of selecting a bit line.

The memory cell array is split into plural subarrays AA, AB, and so forth. The drawing shows that the two subarrays are identified by column address bit A(k+4). Although not shown, generally, a memory cell array is split into more subarrays by plural addresses including the column address bit A(k+4). Or the memory cell array is split into subarrays by being connected to different data buses.

FIG. 1 shows a nonvolatile semiconductor storage device such as flash memory. Electrically rewritable nonvolatile transistors MC are disposed as storage cells between bit lines and ground voltage.

Word lines are wired through the subarrays AA, AB, and so forth and connected in common to gate terminals of nonvolatile transistors MC disposed for each of bit lines BL0A to BL15A, BL0B to BL15B, and so forth wired in the subarrays AA, AB, and so forth. In FIG. 1, a word line WLn is shown as an example.

When the word line WLn becomes a prescribed voltage level and is activated, the nonvolatile transistors MC are biased. However, since threshold voltages of the nonvolatile transistors MC differ depending on whether stored data is "0" or "1," a conduction state between the bit lines BL0A to BL15A, BL0B to BL15B, and so forth, and ground voltage is set according to whether data is "0" or "1." Specifically, the threshold voltage of a nonvolatile memory in which the data "1" is stored is low, and the bit line and ground voltage is in conduction state and a current path is formed. Conversely, the threshold voltage of a nonvolatile memory in which the data "0" is stored is high, and since the bit line and ground voltage is held in non-conduction state, no current path is formed. As a result, data is read out from storage cells selected by the word line WLn to the bit lines BL0A to BL15A, BL0B to BL15B, and so forth.

The read data is decoded by column address bits A(k) to A(k+4), and if necessary, an address (not shown) for identifying subarrays, is read out by that a selected one bit line is connected to the data line DB, and subjected to differential amplification with reference voltage VRF in a differential amplifier 330 through a current-voltage conversion circuit 320.

In the description below, a description of the subarray AA is also applicable to other subarrays AB, and so forth. A variable k in column address bit A(k) denotes a specific bit position. It indicates a bit position, assigned according to an address configuration in a semiconductor storage device.

In FIG. 1, bit lines are selected by four-bit column address bits A(k) to A(k+3). Upper column address bits A(k+1) to A(K+3) of four-bit column address bits A(k) to A(k+3) are decoded by an upper column decoder 11. In upper pass gates 210 and 211, pass gate transistors constituted by NMOS transistors provided for each of bit lines BL0A to BL7A, and BL8A to BL15A are selected. The lower column address bit A(k) is decoded by the lower column decoder 12, and the pass gate transistors constituted by two NMOS transistors within a lower pass gate 220 are selected.

The upper column decoder 11 outputs decode signals YD10 to YD17 according to the logical levels of upper column address bits A(k+1) to A(K+3). An address conversion circuit 20 is provided in an address input stage. The address conversion circuit 20 is provided with two exclusive OR gates, and in place of column address bits A(k+1) and A(k+2) inputted in the conventional technology, exclusive OR of column address bits A(k+1) and A(k+3) and exclusive OR of column address bits A(k+2) and A(k+3) are inputted to an upper column address 11.

Since the exclusive OR operation outputs a low level signal when their logical levels match, and a high level signal when they do not match, according to the logical level of the highest column address bit A(k+3), the logical levels of the residual upper column address bits A(k+1) and A(k+2) are inverted.

Specifically, when the highest column address bit A(k+3) is at a low level, the same logical levels as upper column address bits A(k+1) and A(k+2) are inputted to the upper column decoder 11. By this construction, for (A(k+3),A(k+2),A(k+1))=(0,0,0) to (0,1,1), decode signals YD10 to YD13 become a high level and are activated. Bit lines BL0A to BL3A, and BL8A to BL11A are selected in ascending order in line with physical disposition. When the highest column address bit A(k+3) is at a high level, the logical levels of upper column address bits A(k+1) and A(k+2) are inverted before being inputted to the upper column decoder 11. By this construction, for (A(k+3),A(k+2),A(k+1))=(1,0,0) to (1,1,1), decode signals YD14 to YD17 become a high level and are activated. Bit lines BL4A to BL7A, and BL12A to BL15A are selected in descending order in the reverse direction of physical disposition.

For the lower column address bit A(k) of low level, the lower column decoder 12 outputs decode signal YD20 and selects a left area AA0 in the subarray AA. For the lower column address bit A(k) of high level, the lower column decoder 12 outputs decode signal YD21 and selects a right area AA1 in the subarray AA.

The upper pass gates 210, 211, and so forth disposed in the subarrays AA, AB, and so forth have the same construction, and pass gate transistors in same physical positions are conduction-controlled in common by the identical decode signal YD10 to YD17. Likewise, the low-order pass gates 220, and so forth disposed in the subarrays AA, AB, and so forth have the same construction, and pass gate transistors in same physical positions are conduction-controlled in common by the same decode signals YD20 and YD21. Accordingly, the bit lines BL0A to BL15A, BL0B to BL15B, and so forth in the subarrays AA, AB, and so forth are selected by the column address bits A(k) to A(k+3) in the same order among the subarrays (hereinafter, this configuration will be referred to as shift disposition).

Either one of bit lines BL0A to BL15A wired to the subarray AA is selected by the upper and lower column decoders 11 and 12 and is connected to the data line DB. When the selected one bit line is connected to the data line DB, before data is read, an equalizing signal EQ is activated to a high level in the current-voltage conversion circuit 320. An NMOS transistor M21 is brought into conduction, and charging to the bit line from the data line DB is started through the lower pass gate 220, and the upper pass gate 210 or 211. In this case, a voltage level of the data line DB is detected by an NMOS transistor M23, and a gate voltage level of an NMOS transistor M22 is adjusted through the NMOS transistor M23. As a result, a charging voltage of a path from the data line DB to the bit line is limited to about 0.6V. This voltage limitation is done to avoid the occurrence of an unnecessary write operation or so-called disturb phenomenon due to application of an excessive voltage level to nonvolatile transistors during reading.

When the selected bit line is charged to a prescribed voltage level, the equalizing period ends and the NMOS transistor M21 goes into non-conduction state. After that, according to data stored in a storage cell, a voltage level to a differential amplifier 330 is set depending on whether a current path from the resistor R21 to ground voltage through a nonvolatile transistor constituting the storage cell is formed, and differential amplification for data reading is performed.

After the end of reading, the reset circuit 310 discharges the bit line connected through the upper/lower pass gate 210 or 211/220 from the data line DB to ground voltage.

To perform burst read access, with the selected word line WLn held activated, the column address bits A(k) to A(K+3) and also the address bit A(k+4) and address bit(s) not shown depending on burst length are successively incremented for each read cycle. Specifically, while the left area AA0 and the right area AA1 of the subarray AA are alternately selected for each access, the left four bit lines BL0A to BL3A, and BL8A to BL11A are successively selected in the left and right areas AA0 and AA1 in ascending order with respect to physical disposition, then the right four bit lines BL4A to BL7A, and BL12A to BL15A are successively selected in descending order with respect to physical disposition. Accordingly, bit lines selected in adjacent accesses are apart by the sum of the pitches of eight bit lines constituting the left and right areas AA0 and AA1, so that inter-line parasitic capacitance between the bit lines selected in adjacent accesses is so small that it does not create a problem.

Moreover, even when the burst read access continues beyond the subarray, bit lines selected in adjacent accesses is apart by the sum of four bit line pitches, so that inter-line parasitic capacitance between the bit lines selected in adjacent accesses is so small that it does not create a problem.

Figure 2:
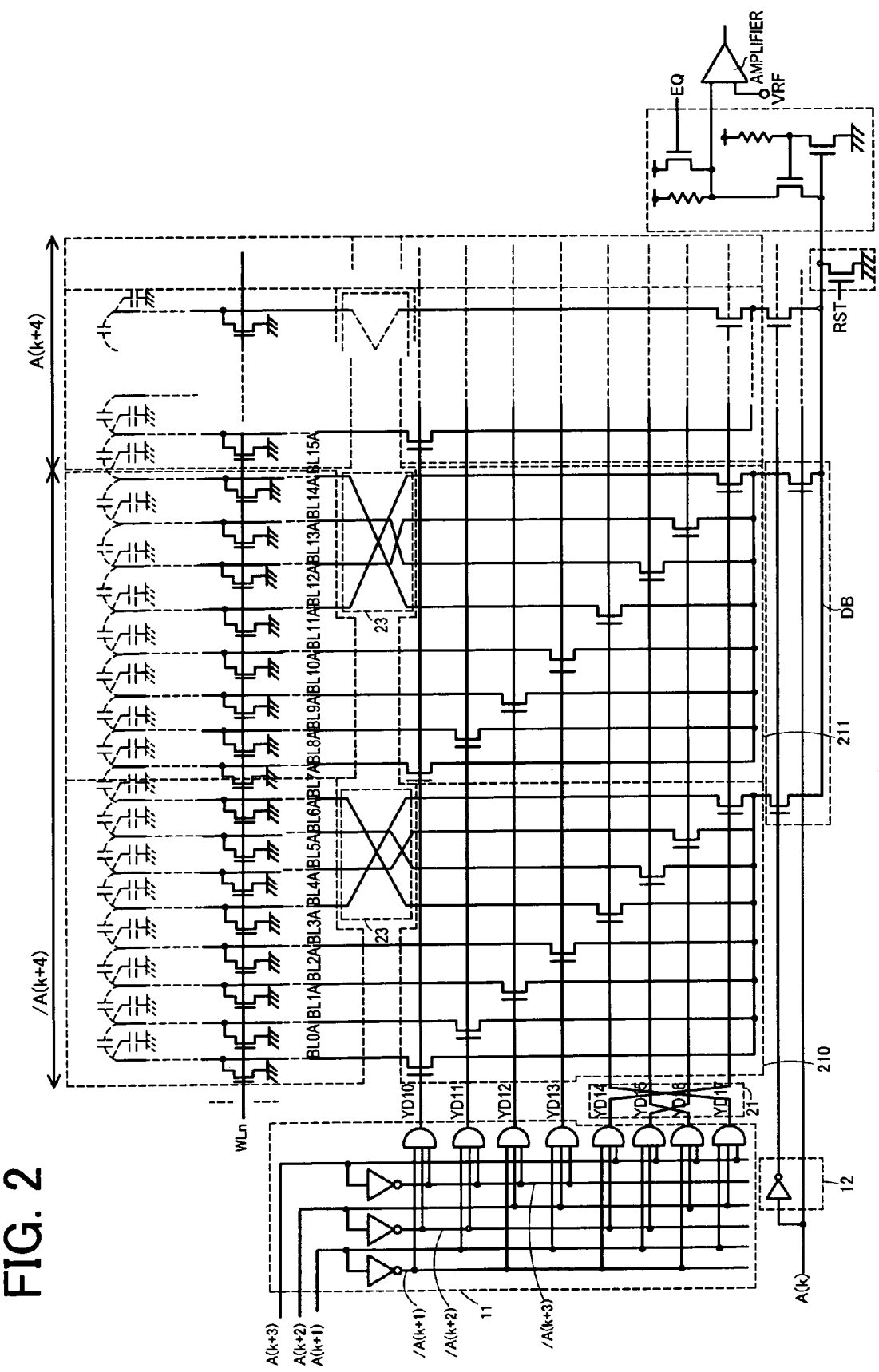
FIG. 2 is another example of a circuit having the same operation and effect as the first embodiment.

A circuit diagram shown in FIG. 2 shows an example of another circuit having the same operation and effect as the circuit in the first embodiment (FIG. 1). In place of the address conversion circuit 20 in the first embodiment (FIG. 1), if there is provided either one of a conversion part 21 that converts connection between decode signals YD14 to YD17 outputted from the upper column decoder 11, and pass gate transistors constituting the upper pass gates 210 and 211, and a conversion part 23 that converts connection between the bit-lines BL4A to BL7A and BL12A to BL15A and the upper pass gates 210 and 211, the same operation and effect as the circuit in the first embodiment (FIG. 1) can be obtained.

It goes without saying that the conversion parts 21 and 23 are not limited to the construction shown in FIG. 2, and their connection construction may be appropriately changed according to the order in which bit lines are selected by the column address bits A(k) to A(k+3). Moreover, if either one of the conversion parts 21 and 23 is provided, the same operation and effect as the first embodiment (FIG. 1) can be obtained, and further the same operation and effect can also be obtained by appropriate combinations of the conversion parts 21 and 23.

Figure 13:
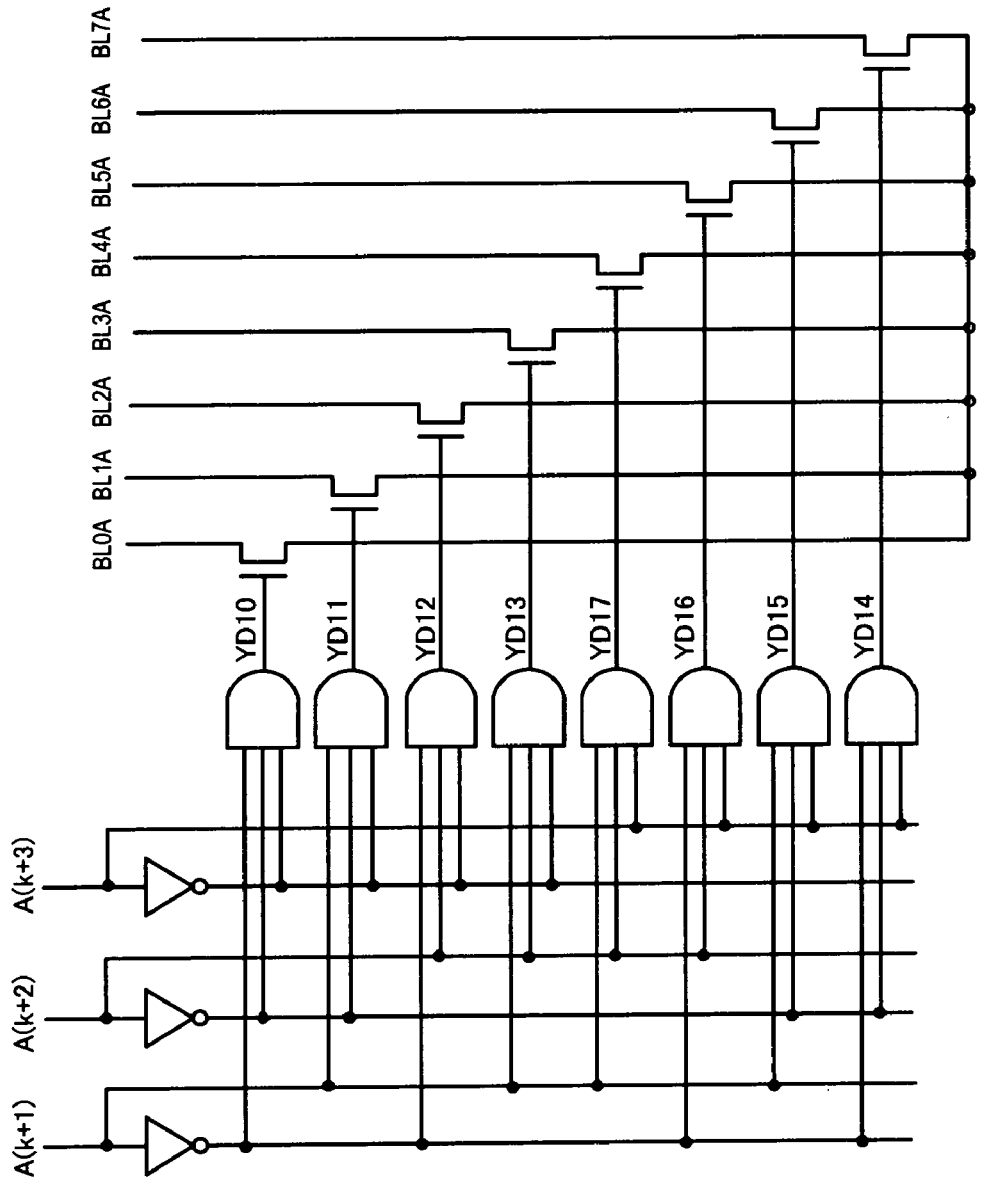
FIG. 13 is an example of a second circuit having the same operation and effect as the first embodiment.

A circuit diagram shown in FIG. 13 shows an example of another circuit having the same operation and effect as the circuit shown in the first embodiment (FIG. 1) and the circuit shown in FIG. 2. In place of the address conversion circuit 20 of FIG. 1 or the conversion part 21 of FIG. 2, address input to a decoding part of the column decoder is changed.

Figure 3:
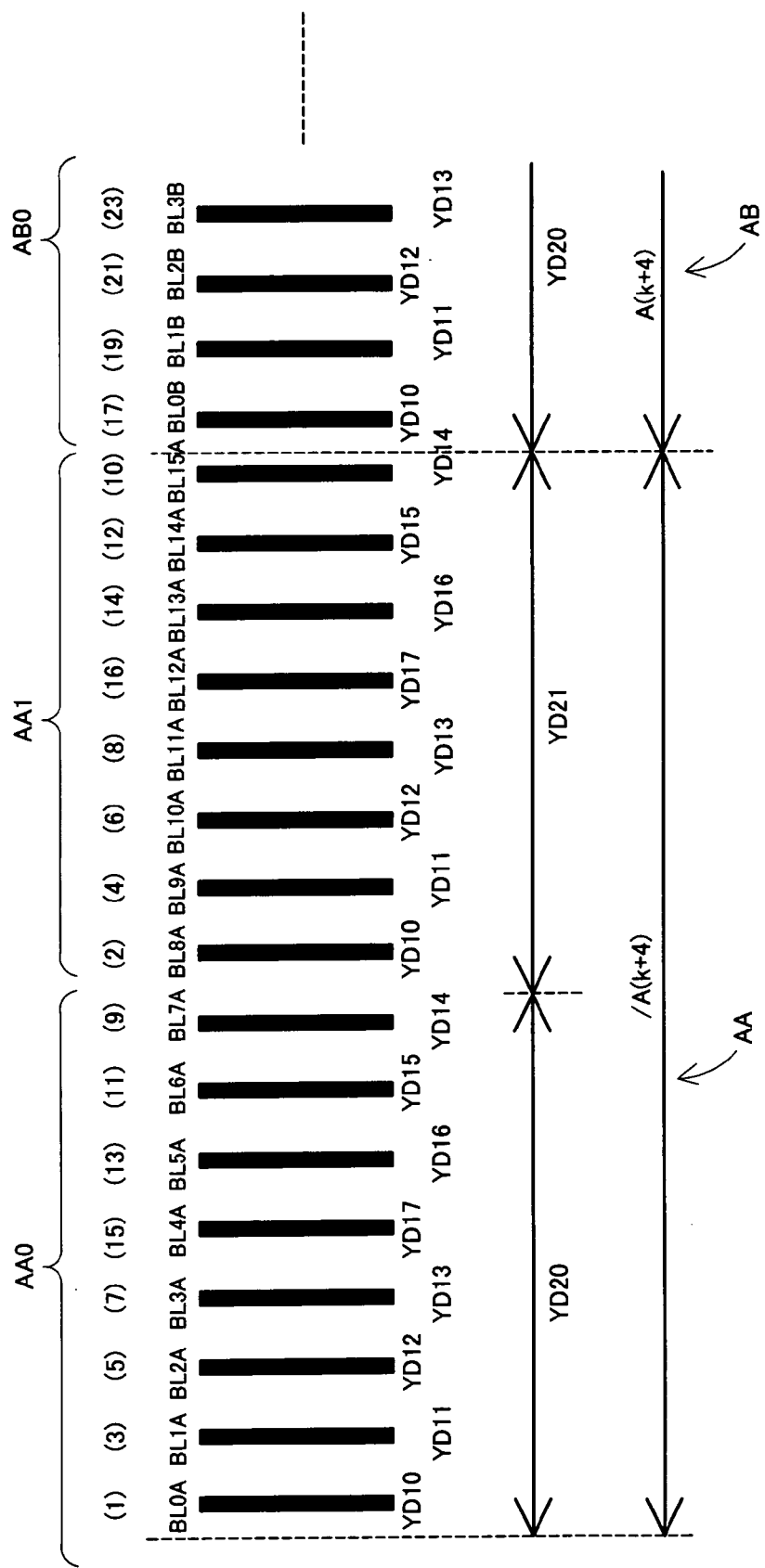
FIG. 3 is a schematic drawing showing the order of selecting bit lines in the first embodiment.

FIG. 3 is a schematic drawing showing the order of selecting bit lines in the first embodiment. It shows the physical disposition of bit lines regarding part of the subarray AA (selected by the address bit A(k+4) of low level) and AB (selected by the address bit A(k+4) of high level). Plural bit lines BL0A to BL15A and BL0B to BL3B are shown. For the physical disposition, a selection order is decided by the upper and lower column decoders 11 and 12, and the address conversion part 20 or the conversion parts 21 and 23, and bit lines are successively selected in the order shown by (1) to (23).

Specifically, by decode signals YD20 and YD21 outputted by the lower column decoder 12, the 16 bit lines within the subarray AA are identified every eight bit lines in the left/right area AA0 and AB0/AA1. Bit lines in the unit of eight bit lines are selected by decode signals YD10 to YD17 successively outputted from the upper column decoder 11.

While the decode signals YD20 and YD21 are alternately switched for each transition of column address, the decode signals YD10 to YD17 are selected one after another. As the order of selecting bit lines, while same physical positions in two pairs of the units of eight bit lines BL0A to BL7A, and BL8A to BL15A are alternately selected for each access, the left bit lines BL0A to BL3A, and BL8A to BL11A within the units are selected in ascending order, and the right four bit lines BL4A to BL7A, and BL12A to BL15A are selected in descending order. When burst read operation continues to the subarray AB beyond the subarray AA, after bit line BL12A is selected last in the subarray AA, bit line BL0B is selected in the subarray AB. A distance between bit lines during continuous access beyond subarrays is equal to the sum of four bit line pitches.

Figure 4:
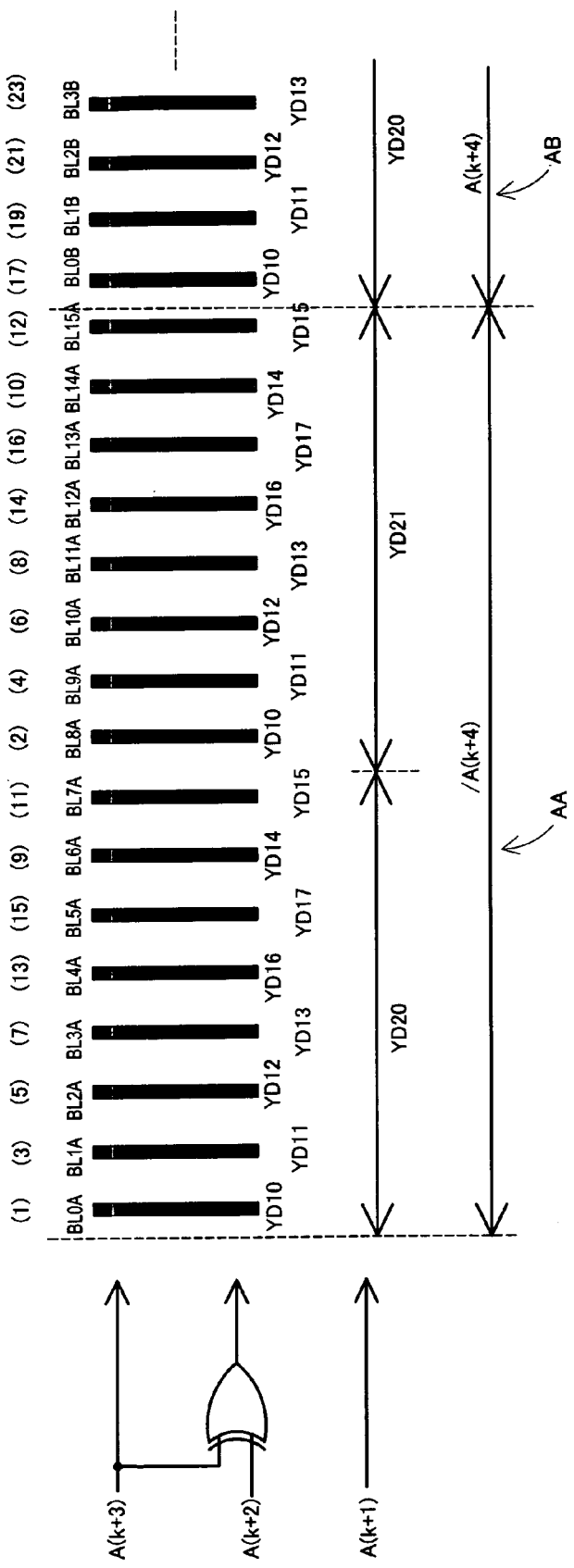
FIG. 4 is a first variant of the first embodiment.
Figure 5:
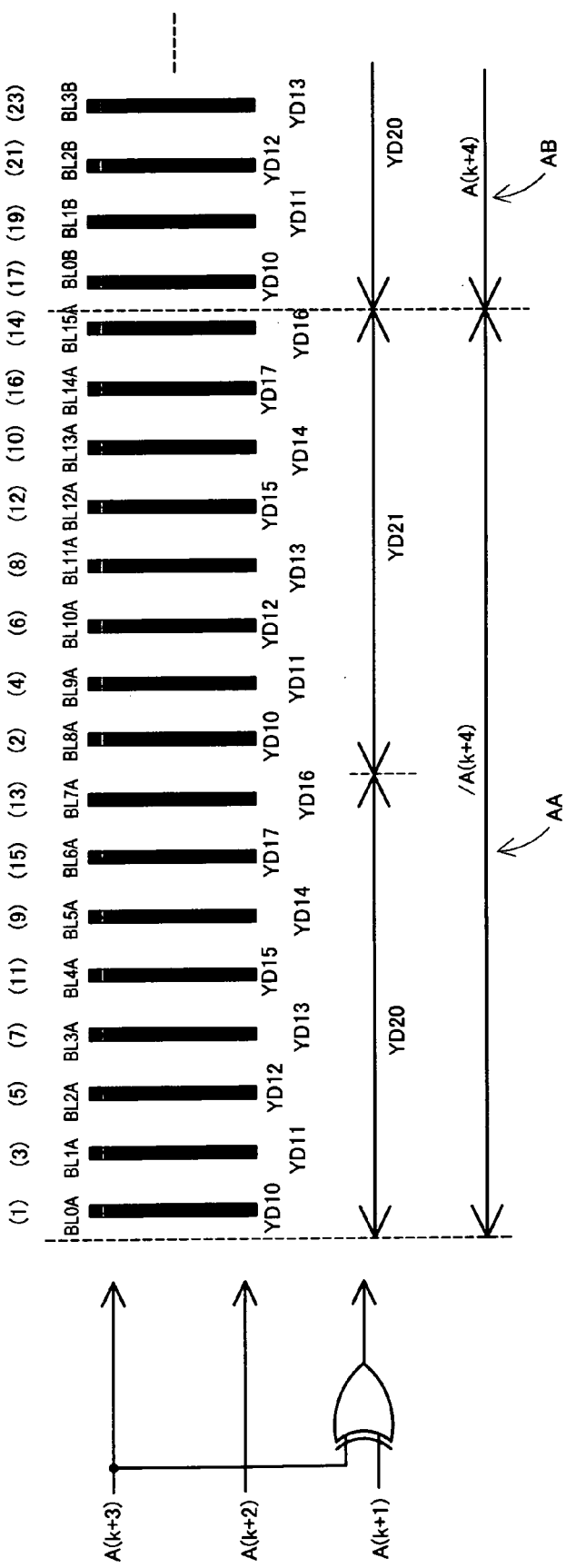
FIG. 5 is a second variant of the first embodiment.
Figure 6:
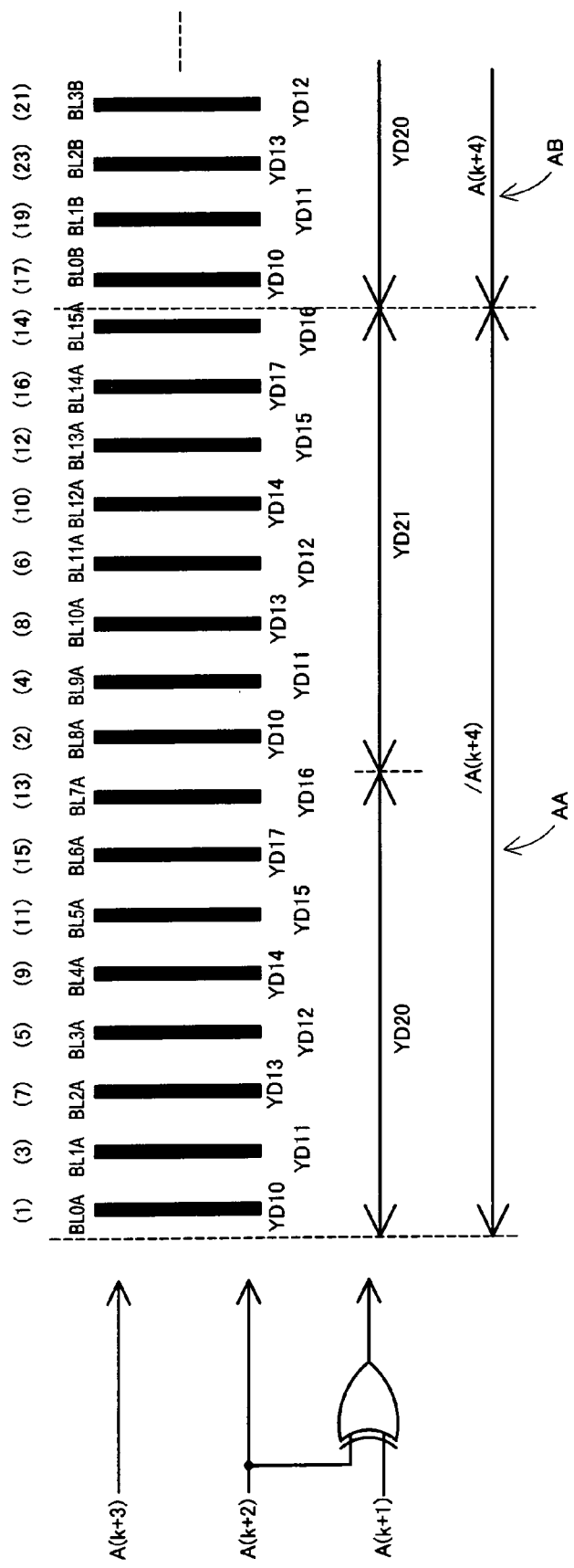
FIG. 6 is a third variant of the first embodiment.

First to third variants of the first embodiment shown in FIGS. 4 to 6 are variants of the address conversion circuit 20 (FIG. 1). These variants relate to combinations of column address bit(s) A(k+2), A(k+1)/A(k+1) of prescribed lower bit positions to invert a logical level according to column address bit A(k+3)/A(k+2) of prescribed upper bit position of column address bits A(k+1) to A(k+3). In each variant, the circuit of the present invention can be realized by providing exclusive OR gate for column address concerned.

A first variant of FIG. 4 inverts the logical level of the column address bit A(k+2) when the column address bit A(k+3) of the highest bit position is at high level. Selection order is inverted for the right four bit lines BL4A to BL7A, and BL12A to BL15A in the unit of eight bit lines. Specifically, bit lines BL6A/14A, BL7A/15A, BL4A/12A, and BL5A/13A are selected in that order. A distance between two bit lines selected in adjacent accesses is equal to the sum of eight bit line pitches during selection in the subarray AA, and equal to the sum of three bit line pitches during selection in the boundary of the subarrays AA and AB.

A second variant of FIG. 5 inverts the logical level of the column address bit A(k+1) when the column address bit A(k+3) of the highest bit position is at high level. Selection order is inverted for the right four bit lines BL4A to BL7A, and BL12A to BL15A in the unit of eight bit lines. Specifically, bit lines BL5A/13A, BL4A/12A, BL7A/15A, and BL6A/14A are selected in that order. A distance between two bit lines selected in adjacent accesses is equal to the sum of eight bit line pitches during selection in the subarray AA, and equal to the sum of two bit line pitches during selection in the boundary of the subarrays AA and AB.

A third variant of FIG. 6 inverts the logical level of the column address bit A(k+1) when the column address bit A(k+2) one bit lower than the highest bit position is at high level. Ascending selection and descending selection are repeated every two lines in the unit of eight bit lines. Specifically, a distance between two bit lines selected in adjacent accesses is equal to the sum of eight bit line pitches during selection in the subarray AA, and equal to the sum of two bit line pitches during selection in the boundary of the subarrays AA and AB.

Figure 7:
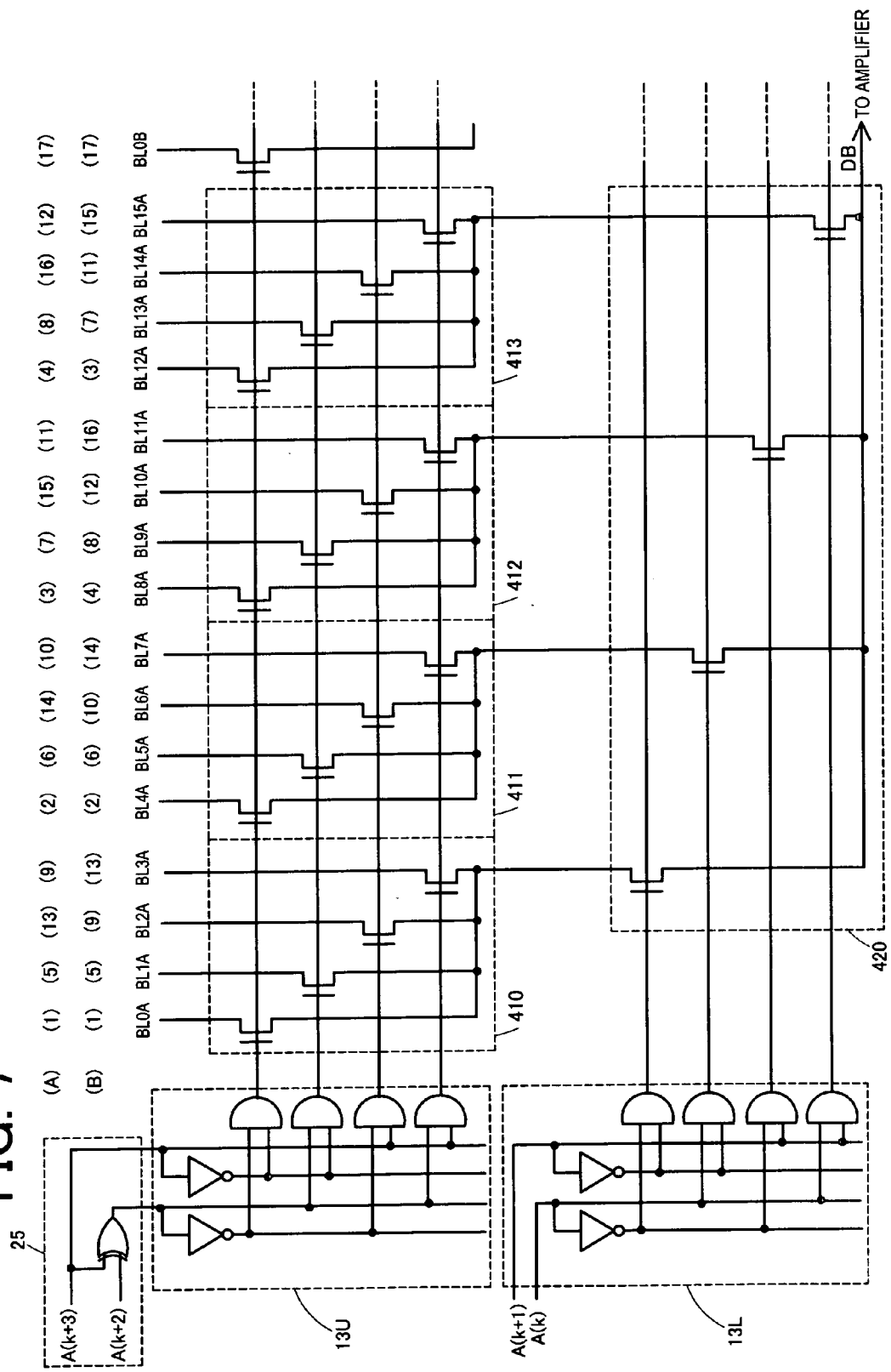
FIG. 7 is a fourth variant of the first embodiment.

Next, as a fourth variant of the first embodiment, a circuit diagram is shown in FIG. 7. In the fourth variant, upper and lower column decoders 13U and 13L are provided in place of the upper and lower decoders 11 and 12 in the first embodiment. Moreover, upper pass gates 410 to 413 and a lower pass gate 420 are provided in place of the upper pass gates 210 and 211 and the lower pass gate 220. Furthermore, an address conversion circuit 25 is provided in place of the address conversion circuit 20.

The upper pass gates 410 to 413 and the lower pass gate 420 each comprise four pass gate transistors. One bit line is selected from a unit of four bit lines by the four upper pass gates 410 to 413 provided every four of 16 bit lines in the subarray AA, and one of the four pass gates 410 to 413 is selected by the lower pass gate 420. As a result, one of the 16 bit lines is selected. The upper column decoder 13U decodes column address bits A(k+2) and A(k+3) of upper two bits, and the lower column decoder 13L decodes column address bits A(k) and A(k+1) of lower two bits.

The address conversion circuit 25 converts column address inputted to the upper column decoder 13U. It includes an exclusive OR gate that performs exclusive OR control for column address bits (k+2) and A(k+3) to input an output signal of the exclusive OR gate in place of input of the column address bit A(k+2).

By this construction, in the unit of four bit lines, the bit lines are split to right and left portions of two bit lines each so that the left two bit lines are selected in ascending order and the right two bit lines are selected in descending order (in the case (A) in FIG. 7).

As the order of selecting bit lines, like the first embodiment, while bit lines in same physical positions are selected by the upper pass gates 410 to 413 provided every four bit lines, the upper pass gates 410 to 413 are successively switched by the lower pass gate 420 for each access.

The distance between bit lines selected between adjacent accesses in the subarray AA is equal to the sum of four bit line pitches, and also the distance between bit lines selected between adjacent accesses even between adjacent subarrays is equal to the sum of four bit line pitches.

In the fourth variant of FIG. 7, the address conversion circuit 25 is provided in a stage of inputting a column address to the upper column decoder 13U. However, the same operation and effect can be obtained even if the address conversion circuit 25 is provided in an input stage of the lower column decoder 13L in place of the upper column decoder 13U or together with the upper column decoder 13U. A bit line selected first or last in the subarray AA may be a bit line in a physical position different from a bit position at each end of the subarray AA. The distance between bit lines successively selected in the subarray AA can be sufficiently increased (the case of (B) in FIG. 7).

As has been described above, according to the semiconductor storage device of the first embodiment and the method of selecting bit lines of the semiconductor storage device, in the subarrays AA and AB being embodiments of the basic bit line group partitioning physically contiguous bit lines BL0A to BL15A, and BL0B to BL15B, when continuous access is performed by successively selecting individual bit lines and connecting them to the differential amplifier 330, the column address bit(s) A(k) (FIGS. 1 and 2) or A(k) and A(k+1) (FIG. 7) being embodiments of lower identification address is decoded by the lower column decoder 12 (FIGS. 1 and 2) or 13L (FIG. 7) being embodiments of lower identification address decoder, and the left/right areas AA0/AA1 and AB0/AB1 (FIGS. 1 and 2) or the unit of four bit lines (FIG. 7) being embodiments of a basic decode unit are successively selected for each access. For the duration of this processing, bit lines selected in the left/right areas AA0/AA1 and AB0/AB1 or the unit of four bit lines are fixed. In the individual left/right areas AA0/AA1 and AB0/AB1 or the unit of four bit lines, bit lines are provided in the unit of eight or four pieces and identified in the same order among them. The left/right areas AA0/AA1 and AB0/AB1 or the unit of four bit lines shift in parallel with each other for disposition (hereinafter referred to as shift disposition).

Therefore, when bit lines successively selected between adjacent accesses are bit lines within the subarrays AA and AB, bit lines successively selected are bit lines disposed in physical positions apart by a distance equal to the sum of the pitches of eight or four bit lines being the construction unit of the left/right areas AA0/AA1 and AB0/AB1.

Also, when bit lines successively selected between adjacent accesses are selected beyond the subarrays AA and AB, since the address conversion circuit 20 (FIG. 1, and FIGS. 4 to 6) or 25 (FIG. 7), or the conversion part 21 or 23 (FIG. 2) inverts the logical levels of column address of lower bit positions according to the logical levels of column address of upper bit positions, a first or last selected bit line in the subarrays AA and AB can be placed in physical positions different from those of bit lines at both ends. The distance between bit lines successively selected between the subarrays can be sufficiently secured.

Inter-line parasitic capacitance existing between bit lines successively selected becomes small, so that an electrical state remaining in a bit line selected in a preceding access exerts no influence on a bit line selected in a succeeding access.

To eliminate the adverse effect of inter-line parasitic capacitance, a shield line does not need to be provided between adjacent bit lines. Without having to pay attention to inter-line parasitic capacitance between bit lines adjacently wired, bit lines can be wired with a minimum clearance allowed by design rules. Bit lines can be efficiently wired in a required minimum area in memory cell arrays.

When cycle time in burst read access is shortened to meet demand for high speed access, time for resetting bit lines may be insufficient. When an increase in the capacity of semiconductor storage devices causes an increase in the wiring capacitance of bit lines, since the bit lines form a CR time constant circuit along with wiring resistors, discharge operation by the reset circuit 310 disposed in the data line DB may becomes increasingly difficult. In nonvolatile semiconductor storage devices such as flash memory, residual charges not discharged in a reset period are discharged in the next access cycle or later through nonvolatile transistors in which data "1" is stored.

In nonvolatile semiconductor storage devices such as flash memory, to prevent wrong write to nonvolatile transistors due to a disturb phenomenon during data reading, bias voltage to bit lines is limited to as low as about 0.6 V. Even in this case, discharge operation of residual charges does not badly affect selected bits due to capacitance coupling, so that stable read operation can be performed without being affected by capacitance coupling, regardless of low bias voltage in the bit lines.

Figure 8:
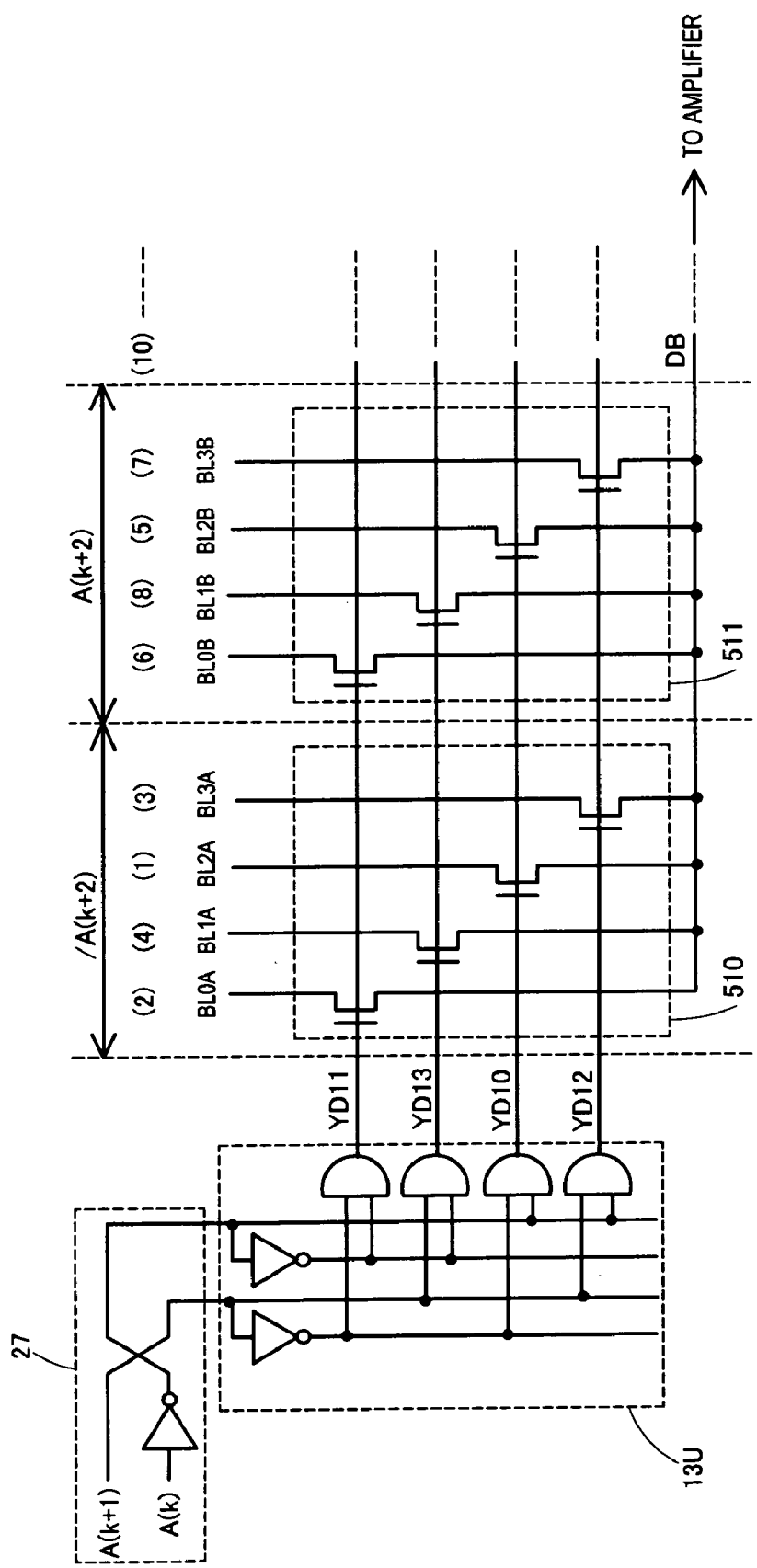
FIG. 8 is a circuit diagram of a second embodiment.

A circuit diagram of a second embodiment shown in FIG. 8 shows a circuit configuration in which plural bit lines disposed in a memory cell array is partitioned into the units of four bit lines BL0A to BL3A and BL0B to BL3B (basic bit line groups) identified by column address bit A(k+2), and one bit line from among them is selected to connect it to the data line DB, and a method of selecting the bit lines. In the first embodiment, the subarrays AA and AB are halved to the left and right areas AA0 and AA1, and AB0 and AB1, respectively, and bit lines are alternately selected between the left and right areas for each access. The second embodiment is different from the first embodiment in that bit lines are successively selected for each of basic bit line groups of four bit lines each.

In the second embodiment, pass gates 510 and 511 are provided in place of the upper pass gates 210 and 211, and the lower pass gate 220 of the first embodiment (FIG. 1), and connected to the data line DB through a pass gate transistor provided for each of basic bit line groups of four bit lines each. Moreover, in place of the upper and lower column decoders 11 and 12, a column decoder 13U is provided and selects one pass gate transistor for each of the pass gates 510 and 511 according to outputted decode signals YD10 to YD13.

Since the pass gates 510 and 511 both have a same construction and are connected in common to the decode signals YD10 to YD13 that conduction-control pass gate transistors, bit lines in same physical positions are selected according to given decode signals (hereinafter referred to as shift disposition of basic bit line groups).

Moreover, an address conversion circuit 27 is provided in place of the address conversion circuit 20. For the column address bits A(k) and A(k+1) inputted to the column decoder 13U, the address conversion circuit 27 supplies the column address bit A(k) after inverting it to reverse bit positions. Accordingly, according to the logical levels of the column address bits A(k) and A(k+1), the output positions of the decode signals YD10 to YD13 selected by the column decoder 13U are converted. As a result, bit lines of the basic bit line group of four bit lines each are selected in the order of BL2A, BL0A, BL3A, BL1A, BL2B, BL0B, BL3B, and BL1B.

A distance between bit lines selected in adjacent accesses is equal to the sum of two or three bit line pitches in basic bit line group of four bit lines each, and the sum of five bit line pitches in accesses beyond the basic bit line group of four bit lines each.

Figure 9:
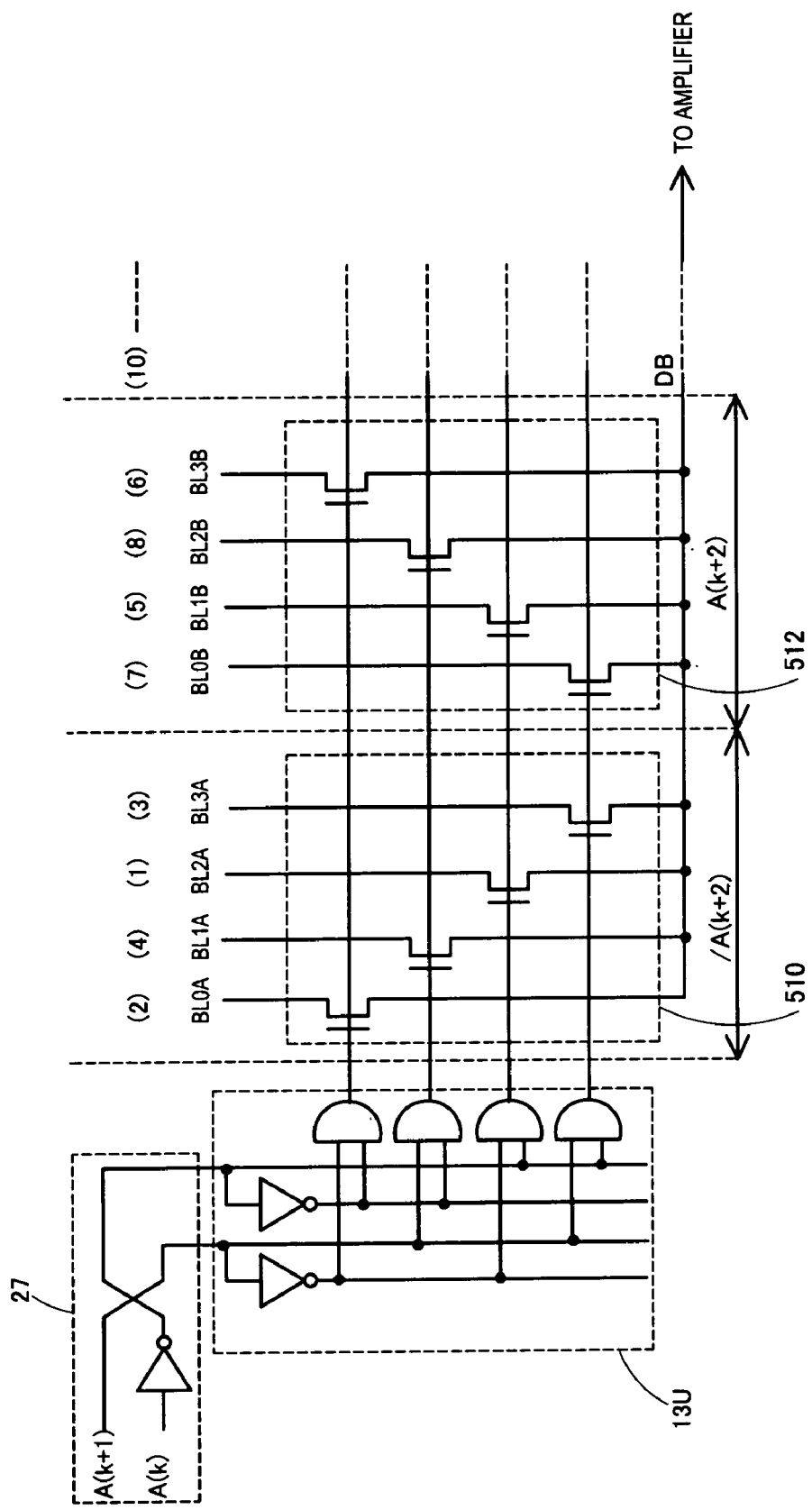
FIG. 9 is a first variant of the second embodiment.

In a first variant of the second embodiment shown in FIG. 9, in place of the pass gate 511 in the second embodiment of FIG. 8, a pass gate 512 that reverses the order of supplying the decode signals YD10 to YD13 controlling pass gate transistors is provided. Accordingly, a unit of four bit lines BL0A to BL3A and a unit of four bit lines BL0B to BL3B are symmetrical to a mirror face in terms of the order of selecting the bit lines (hereinafter referred to mirror disposition of basic bit line group). Specifically, bit lines in basic bit line group of four bit lines each are selected in the order of BL2A, BL0A, BL3A, BL1A, BL1B, BL3B, BL0B, and BL2B.

Also in this case, a distance between bit lines selected in adjacent accesses is equal to the sum of two or three bit line pitches in basic bit line group of four bit lines each, and the sum of four bit line pitches in accesses beyond the basic bit line group of four bit lines each.

Figure 10:
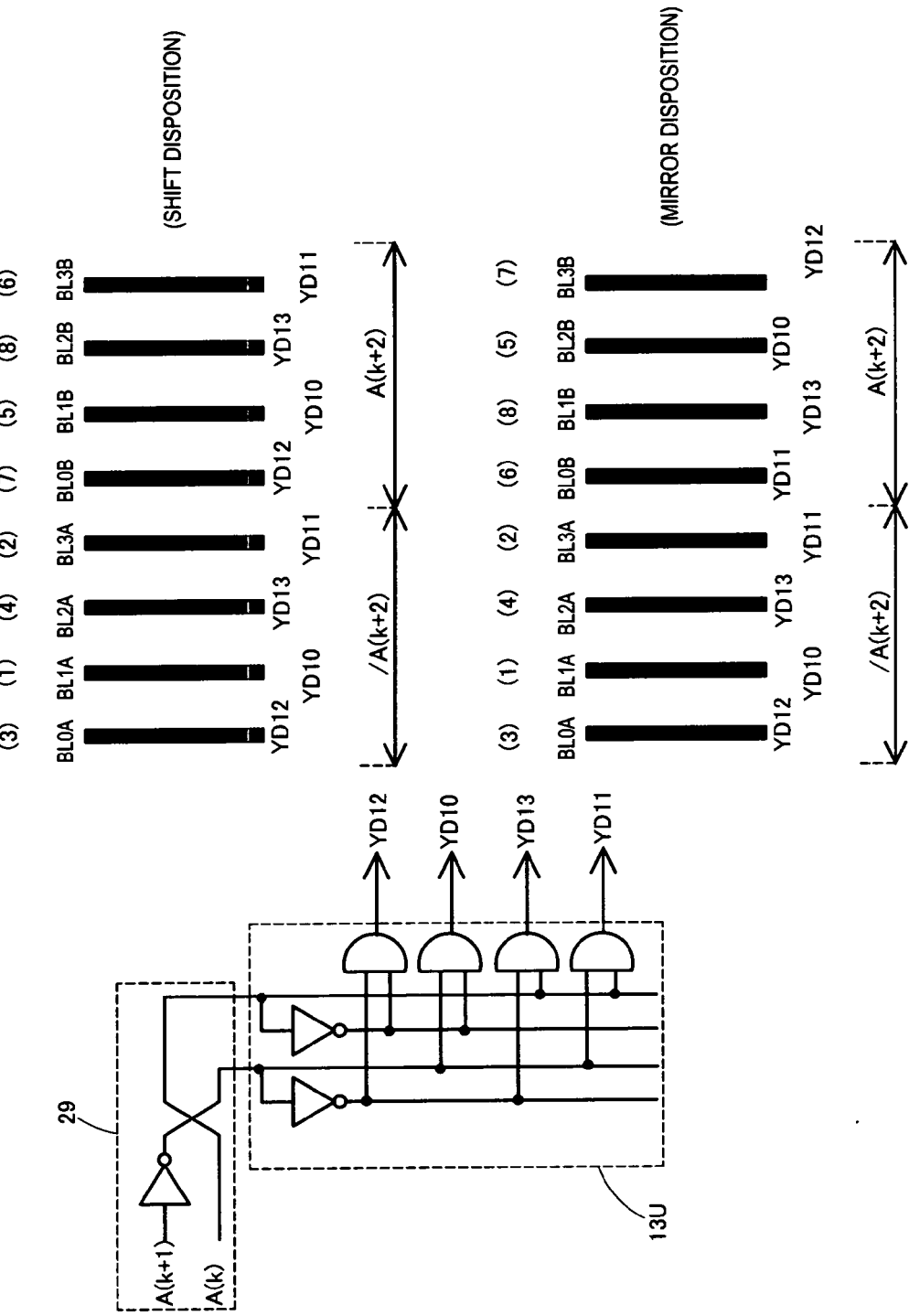
FIG. 10 is a second variant of the second embodiment.
Figure 11:
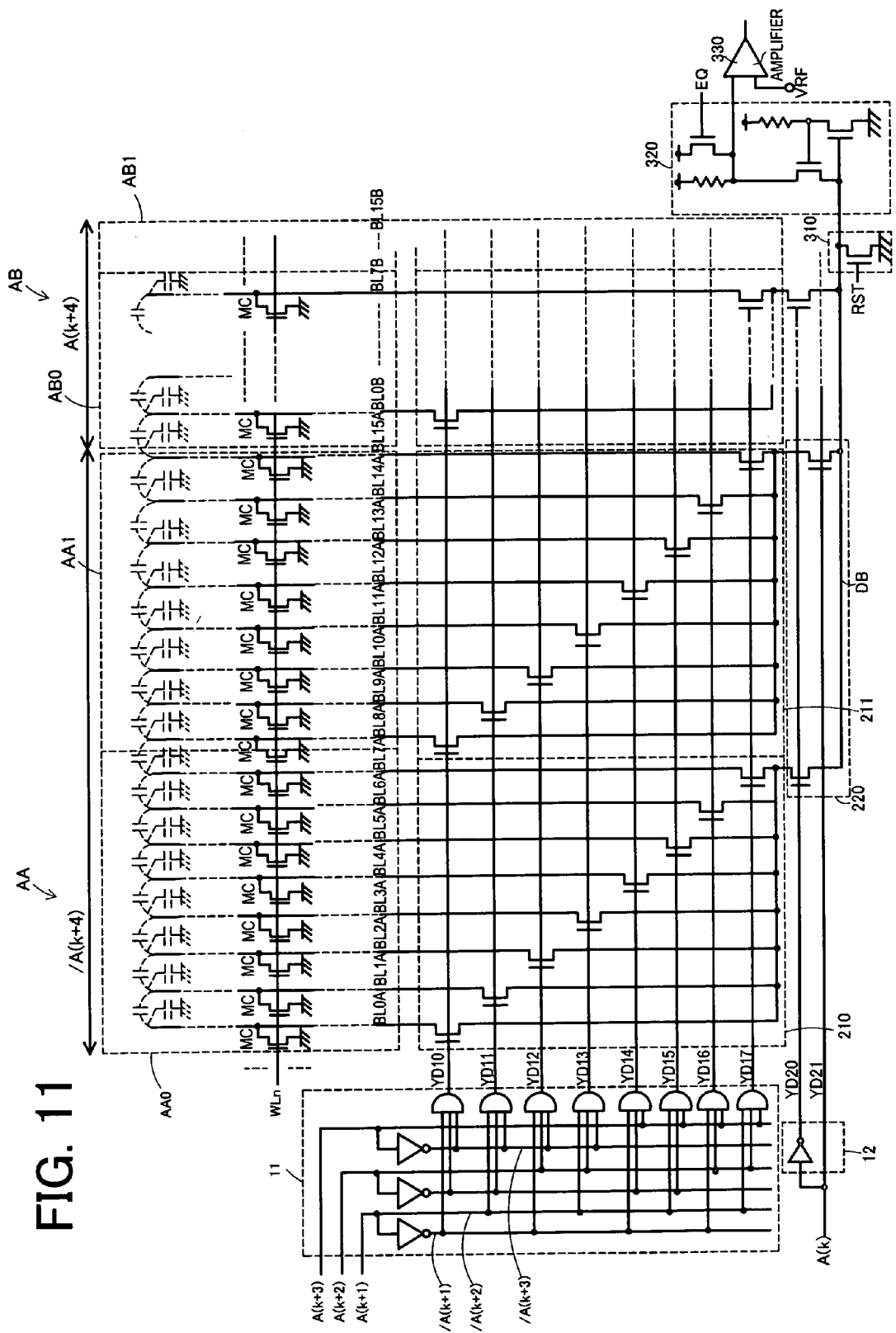
FIG. 11 is a circuit diagram of conventional technology.
Figure 12:
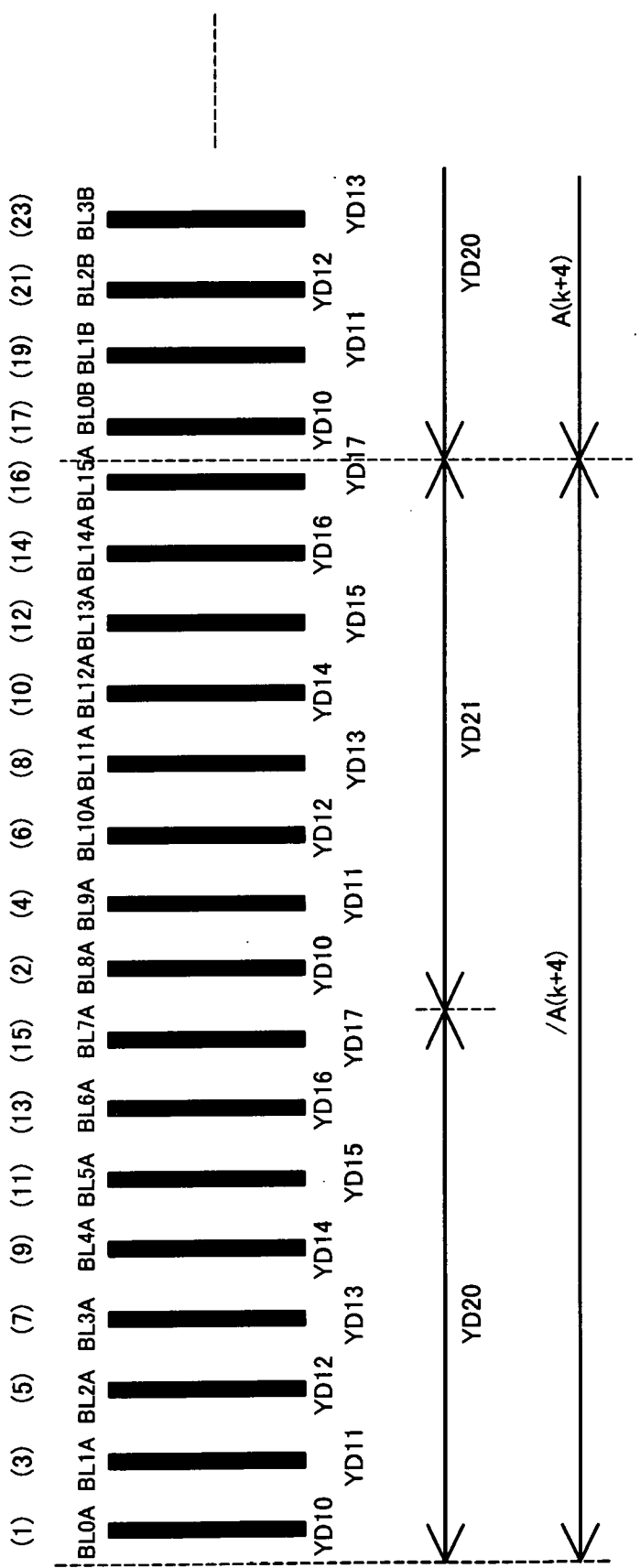
FIG. 12 is a schematic drawing showing the order of selecting bit lines in the conventional technology.

In a second variant of the second embodiment shown in FIG. 10, in place of the address conversion circuit 27 in the second embodiment of FIG. 8, an address conversion circuit 29 is provided. While the column address bit A(k+1) is logically inverted by the address conversion circuit 27 (FIG. 8), the column address bit A(k+2) is supplied in a logically inverted state. In addition, shift disposition including the pass gates 510 and 511, or mirror disposition including the pass gates 510 and 512 can be selected.

By this construction, bit lines in basic bit line group of four bit lines each are selected in the order of BL1A, BL3A, BL0A, BL2A, BL1B, BL3B, BL0B, and BL2B in the case of shift disposition, and BL1A, BL3A, BL0A, BL2A, BL2B, BL0B, BL3B, and BL1B in the case of mirror disposition.

A distance between bit lines selected in adjacent accesses is equal to the sum of two or three bit line pitches in basic bit line group of four bit lines each, and the sum of three bit line pitches (shift disposition) or four bit line pitches (mirror disposition) in the case of access beyond units of four bit lines each.

As has been described above, according to the semiconductor storage device of the second embodiment and the method of selecting bit lines of the semiconductor storage device, since one of the column address bits A(k) and A(k+1) being embodiments of identification address of two bits for identifying the order of selecting bit lines is logically inverted to reverse bit positions, the order of selecting bit lines in basic bit line group may be the first selection order (FIGS. 8 and 9) or the second selection order (FIG. 10). The disposition of basic bit line groups may be either of shift disposition and mirror disposition.

When continuous access is made by successively selecting individual bit lines and connecting them to an amplifier circuit, bit lines successively selected between adjacent accesses can be handled as bit lines disposed in physical positions apart by the sufficient distance of two to four bit line pitches without being physically adjacent. Inter-line parasitic capacitance existing between bit lines successively selected becomes small, so that an electrical state remaining in a bit line selected in a preceding access exerts no influence on a bit line selected in a succeeding access.

Even if advances in the miniaturization and large capacity of semiconductor storage devices increase the wiring capacitance of bit lines and inter-line parasitic capacitance between adjacent bit lines, and high-speed operation causes the occurrence of residual charges of bit lines after access, an adverse effect on bit lines selected in succeeding accesses can be eliminated.

To eliminate the adverse effect of inter-line parasitic capacitance, a shield line does not need to be provided between adjacent bit lines, and desirably in terms of chip integration, bit lines can be efficiently disposed in memory cell arrays.

It goes without saying that the present invention is not limited to the above-mentioned embodiments, and may be modified in various ways without departing from the scope and spirit of the present invention.

In this embodiment, a nonvolatile semiconductor storage device such as a flash memory is described as an example of a semiconductor storage device. However, the present invention is not limited to this embodiment, The present invention can also apply to a semiconductor storage device in which, with a storage cell connected to each of plural bit lines, continuous access is performed by that the bit lines are successively selected and connected to an amplifier circuit, wherein the semiconductor storage device has a circuit configuration in which electrical fluctuation of a non-selected bit line affects a selected bit line due to capacitive coupling by inter-line parasitic capacitance.

Although a semiconductor storage device is described in this embodiment, the circuit example in the embodiment is not a circuit specialized in semiconductor storage devices and memory macros incorporated in semiconductor integrated circuit devices other than semiconductor storage devices also have the same circuit configuration as the circuit example. Therefore, it goes without saying that the present invention can apply to such memory macros.

Although, in this embodiment, burst read access is described as an example of continuous access, the present invention is not limited to this embodiment. The present invention is also effective in write operation requiring that electrical fluctuation of non-selected bit lines does not affect selected bit lines.

As is apparent from the above description, according to the present invention, there can be provided a semiconductor storage device that enables stable continuous access operation by eliminating adverse effects due to capacitance coupling from adjacent bit lines without an increase in chip die size, and a method of selecting bit lines of the semiconductor storage device.

What is claimed is:

1. A semiconductor storage device in which, with a storage cell connected to each of plural bit lines, continuous access is performed by that the bit lines are successively selected and connected to an amplifier circuit,
wherein physically contiguous bit lines are partitioned into basic bit line groups in each of which two or more basic decode units identified by a lower identification address of a prescribed number of bits are contiguously disposed with bit lines within the basic decode unit being identified by a same order among the basic decode units, wherein the basic decode unit is constituted by bit lines identified by an upper identification address of a prescribed number of bits, and the semiconductor storage device comprises:
an upper identification address decoder for selecting a prescribed bit line within the basic decode unit;
a lower identification address decoder for selecting a prescribed basic decode unit; and
an address conversion part that allocates at least one of a start address or an end address in identification address represented by the upper identification address and the lower identification address that identify bit lines partitioned into a basic bit line group to bit lines in physical positions other than those of bit lines in both ends of the basic bit line group.

2. The semiconductor storage device according to claim 1, wherein the basic decode unit includes $2^n$ bit lines identified by the upper identification address of n bits,
wherein the basic bit line group includes two basic decode units identified by the lower identification address of one bit, and
wherein the address conversion part inverts, according to the logical level of an address in the highest bit position of the upper identification address, the logical level of address in residual bit positions.

3. The semiconductor storage device according to claim 1, wherein the basic decode unit includes $2^n$ bit lines identified by the upper identification address of n bits,
wherein the basic bit line group includes $2^m$ basic decode units identified by the lower identification address of m ($m \geq 2$) bits, and
wherein the address conversion part inverts, according to the logical level of an address in the highest bit position of the upper or lower identification address, the logical level of address in residual bit positions.

4. The semiconductor storage device according to claim 1, wherein the basic decode unit includes $2^n$ bit lines identified by the upper identification address of n bits,
wherein the basic bit line group includes $2^m$ basic decode units identified by the lower identification address of m ($m \geq 2$) bits, and
wherein the address conversion part inverts, according to the logical level of an address in a prescribed bit position of the upper or lower identification address, the logical level of at least one of addresses in bit positions lower than the prescribed bit position.

5. The semiconductor storage device according to claim 2, wherein the address conversion part includes an exclusive OR operation part, and
inverts the logical level(s) of the address(es) in the residual bit positions or the lower bit positions, based on an exclusive OR of an address in the highest bit position and address in the residual bit positions, or an address in the prescribed bit position and address in the lower bit positions.

6. A semiconductor storage device in which, with a storage cell connected to each of plural bit lines, continuous access is performed by that the bit lines are successively selected and connected to an amplifier,
wherein physically contiguous bit lines are partitioned into a basic bit line-group of four bit lines each, and
wherein the semiconductor storage device includes an address conversion part that allocates, of identification address of two bits identifying the order of selecting bit lines in the basic bit line group, an upper identification address to a lower physical address identifying the physical position of bit lines and an inverted lower identification address to an upper physical address identifying the physical positions of bit lines.

7. A semiconductor storage device in which, with a storage cell connected to each of plural bit lines, continuous access is performed by that the bit lines are successively selected and connected to an amplifier,
wherein physically contiguous bit lines are partitioned into a basic bit line group of four bit lines each, and
wherein the semiconductor storage device includes an address conversion part that allocates, of identification address of two bits identifying the order of selecting bit lines in the basic bit line group, an inverted upper identification address to a lower physical address identifying the physical position of bit lines and a lower identification address to an upper physical address identifying the physical position of bit lines.

8. The semiconductor storage device according to claim 6, wherein the basic bit line group partitioning physically contiguous bit lines are disposed identically or inversely in terms of the order of identifying bit lines between adjacent basic bit line groups.

9. The semiconductor storage device according to claim 7, wherein the basic bit line group partitioning physically contiguous bit lines are disposed identically or inversely in terms of the order of identifying bit lines between adjacent basic bit line groups.

10. A method of selecting bit lines in a semiconductor storage device in which, with a storage cell connected to each of plural bit lines, continuous access is performed by that the bit lines are successively selected and connected to an amplifier,
wherein physically contiguous bit lines are partitioned into basic bit line groups in each of which two or more basic decode units are contiguously disposed with bit lines within the basic decode unit being identified by a same order among the basic decode units, wherein the basic decode unit is constituted by bit lines identified by a partial identification address of a prescribed number of bits, and
wherein the method of selecting bit lines includes the steps of:
performing successive selections of bit lines partitioned into the basic bit line groups by successively changing selected basic decode units, with the physical positions of bit lines within the basic decode unit being fixed; and
allocating at least one of a first selection or last selection of successive selections of bit lines partitioned into the basic bit line groups to a bit line in a physical position other than those of bit lines at both ends of the basic bit line group.

11. The method of selecting bit lines in a semiconductor storage device according to claim 10, wherein the basic decode unit includes $2^n$ bit lines identified by the partial identification address of n bits, wherein the basic bit line group includes two basic decode units, and wherein the allocating step divides bit lines disposed in the basic decode unit to subunits of $2^{(n-1)}$ bit lines each, and selects bit lines in ascending order of the physical positions of bit lines in one subunit, and in descending order of the physical positions of bit lines in the other subunit.

12. The method of selecting bit lines in a semiconductor storage device according to claim 10, wherein the basic decode unit includes $2^n$ bit lines identified by the partial identification address of n bits, wherein the basic bit line group includes $2^m$ ($m \geq 2$) basic decode unit, and wherein the allocating step includes the steps of:

dividing bit lines disposed in the basic decode unit to subunits of $2^{(n-1)}$ bit lines each, or dividing the basic decode unit disposed in the basic bit line group to $2^{(m-1)}$ sub-decode units; and selecting bit lines in ascending order of the physical positions of bit lines or basic decode units in one subunit or sub-decode unit, and selecting bit lines in descending order of the physical positions of bit lines or basic decode units in the other subunits or sub-decode units.

13. A method of selecting bit lines in a semiconductor storage device in which, with a storage cell connected to each of plural bit lines, continuous access is performed by that the bit lines are successively selected and connected to an amplifier, wherein physically contiguous bit lines are partitioned into a basic bit line group of four bit lines, and wherein the method of selecting bit lines includes the steps of:

successively selecting bit lines partitioned into the basic bit line groups in terms of physical positions in a first selection order in which the bit lines are selected in a third physical position, a first physical position, a fourth physical position, and a second physical position, or in a second selection order in which the bit lines are selected in a second physical position, a fourth physical position, a first physical position, and a third physical position; and partitioning physically contiguous bit lines by disposing basic bit line groups having any one of the first or second selection order, or by alternately disposing basic bit line groups having the first or second selection order.

* * * * *